(12) United States Patent
Himeno et al.

(10) Patent No.: US 7,262,636 B2
(45) Date of Patent: Aug. 28, 2007

(54) METHOD AND SYSTEM FOR A CIRCUIT FOR TIMING SENSITIVE APPLICATIONS

(75) Inventors: Toshihiko Himeno, Yokohama (JP); Stephen D. Weitzel, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 11/154,765

(22) Filed: Jun. 16, 2005

(65) Prior Publication Data
US 2006/0284648 A1 Dec. 21, 2006

(51) Int. Cl.
*H03K 19/0175* (2006.01)
(52) U.S. Cl. .......................... 326/82; 326/23
(58) Field of Classification Search ............. 326/82, 326/83, 86, 22, 23; 327/108, 109
See application file for complete search history.

(56) References Cited

OTHER PUBLICATIONS

Weste, Neil H.E., "Principles of CMOS VLSI Design", 3rd Ed., pp. 218-221, May 11, 2004.

*Primary Examiner*—James H. Cho
(74) *Attorney, Agent, or Firm*—Sprinkle IP Law Group

(57) ABSTRACT

Systems and methods for circuits with substantially equal propagation delay while providing different drive strengths are disclosed. These systems and methods may allow for a circuit with a drive strength that is some ratio of an arbitrary strength full drive strength circuit. Additionally, these circuits may have substantially the same input capacitance and feedback current as the baseline drive circuit. The input of such a circuit may be coupled to three nodes, one of which is an inverter coupled to the logic to be driven, the second of which is dummy logic, and the third of which is an inverter the output of which is left floating.

15 Claims, 7 Drawing Sheets

METHOD AND SYSTEM FOR A CIRCUIT FOR TIMING SENSITIVE APPLICATIONS

TECHNICAL FIELD OF THE INVENTION

The invention relates in general to circuits, and more particularly, to methods and systems for circuits for use with timing sensitive devices.

BACKGROUND OF THE INVENTION

With the advent of the computer age, electronic systems have become a staple of modern life. Part and parcel with this spread of technology comes an ever greater drive for more functionality from these electronic systems. A microcosm of this quest for increased functionality is the size and capacity of various semiconductor devices. From the 8 bit microprocessor of the original Apple I, through the 16 bit processors of the original IBM PC AT, to the current day, the processing power of semiconductors has grown while the size of these semiconductors has consistently been reduce. In fact, Moore's law recites that the number of transistors on a given size piece of silicon will double every 18 months.

As semiconductors have evolved into these complex systems utilized in powerful computing architectures, almost universally, the frequency at which these semiconductors devices operate has been increasing. These modern high-performance systems are designed with a target clock frequency. The clock frequency determines the processing speed of the system.

The continuous quest for higher semiconductor performance has pushed clock frequencies deep into the gigahertz frequency range, reducing the period of the clock signal well below a nanosecond. As the working frequency of advanced semiconductor systems has entered the gigahertz domain, designing clock distribution networks for these semiconductor devices becomes much more challenging.

Clock distribution networks are used to distribute a clock signal to the circuits on a semiconductor device that require that clock. An embodiment for one methodology for distributing clock signals within a semiconductor device, known as a clock distribution tree is depicted in FIG. 1. A clock signal may be produced by a phase locked loop (PLL) 110 on semiconductor device 100. Areas 120, 130 on semiconductor device 100 may utilize the clock signal produced by PLL 110. Thus, the clock signal produced by PLL 110 may be distributed to areas 120, 130 by a clock distribution tree. As clocks are used to drive processors or to synchronize the data distribution between or among gates or circuits in areas 120, 130, design of these clock distribution networks have become an important part of semiconductor design.

In particular, clock skew, which is defined as the time difference between clock transitions within a system, can have a large impact on the overall performance of a semiconductor. As speeds are increasing, clock periods are getting shorter, and, hence, skews are becoming more of a problem. The primary objective of a clock distribution tree is therefore to minimize the signal skew at sinks with minimal phase delay, wire length, area and power consumption. Deviations of the clock signal produced by PLL 110 from a target delay can cause incorrect data to be latched within a register in areas 120 or 130, resulting in the malfunction of semiconductor 100. These deviations of the delay of a signal from a target value are described as delay uncertainty. The uncertainty of the clock signal delay is caused by a number of factors that affect a clock distribution tree, examples of which include process and environmental parameter variations. Effects such as the non-uniformity of the gate oxide thickness and imperfections in the polysilicon etching process can cause variations in the current flow within a transistor, thereby introducing delay uncertainty. In addition, variations in the geometric parameters of the interconnect wires introduce uncertainty in the signal characteristics.

More specifically, the length of the clock distribution tree between PLL 110 and areas 120, 130 introduces signal delay. Inserting buffers along an interconnect line in the clock distribution tree between PLL 110 and areas 120, 130 may help alleviate the dependence of the signal propagation delay on the line length of clock distribution tree between PLL 110 and areas 120, 130, permitting an interconnect line between PLL 110 and areas 120, 130 to behave more akin to a simple capacitive line.

Typically, clock buffers are inserted in a bottom-up approach, starting from the leaves of the clock distribution tree (i.e. the clocked elements) at the lowest level and advancing towards the root of the clock distribution tree. When an intermediate node in the tree is reached, the total load from that node to the bottom of the clock distribution tree is the summation of the capacitive load of the interconnect lines and the clocked elements which exist from that node to the bottom of the clock distribution tree. The magnitude of this downstream load may determine the size of the inserted buffer.

FIG. 2 represents one embodiment of the semiconductor device of FIG. 1 with buffers inserted in the clock distribution tree. Buffers 250, 260 are utilized in conjunction with the clock distribution tree in order to distribute a clock generated by PLL 210 to clocked elements in areas 220, 230 and any clocked elements downstream of these areas 220, 230.

One embodiment of a circuit suitable for implementing buffers 250, 260 is presented in FIG. 3. A clock signal is input to inverter 310 which drives the clock signal through the clock distribution tree to downstream logic 320, including clocked elements. Thus, circuit 300 may drive the clock signal into capacitance load C of logic 320. Suppose, however, the capacitance load of the logic into which buffer 260 is driving a signal is half the capacitance load of the logic into which buffer 250 is driving a signal. In this case, the inverter of buffer 260 may be half the strength of the inverter of buffer 250. This means that the input impedance of buffer 260 may be roughly half of that of buffer 250. In order for buffers 250, 260 to be more effective, however, ideally buffers 250, 260 would be easy to implement, and have the same input impedance in order to achieve the same timing signal propagation while simultaneously having different output driveability to optimize power consumption.

Thus, a need exists for circuits which have substantially equal propagation delay and timing skew where these circuits are operable to provide different drive strengths.

SUMMARY OF THE INVENTION

Systems and methods for circuits with substantially equal propagation delay while providing different drive strengths are disclosed. These systems and methods may allow for a circuit with a drive strength that is some ratio of an arbitrary strength full drive strength circuit. Additionally, these circuits may have substantially the same input capacitance and feedback current as the baseline circuit. The input of such a circuit may be coupled to three nodes, one of which is an inverter coupled to the logic to be driven, the second of which is dummy logic, and the third of which is an inverter the output of which is left floating.

In one embodiment, the input of a circuit is coupled to a first inverter for driving an input signal, a dummy logic coupled and a second inverter whose output is floating.

In another embodiment, the circuit has substantially the same input capacitance and timing delay as a baseline circuit with a baseline inverter with a baseline drive strength for driving a baseline capacitance load.

In yet another embodiment, the first inverter has a drive strength $$\frac{1}{m}$$

that of the baseline drive strength.

In still another embodiment, the dummy logic has a capacitance load $$\frac{1}{m}\left(1-\frac{1}{n}\right)$$

that of the baseline capacitance load.

In other embodiments, the second inverter has a drive strength $$\frac{1}{mn}$$

that of the baseline drive strength.

In still other embodiments, the logic has a capacitance $$\frac{1}{m}$$

that of the baseline capacitance.

Embodiments of the present invention provide the technical advantage of having circuits with different drive strengths that have substantially equal input capacitances and timing delays. Circuits of this type may be particularly useful when used as buffer circuits in a clock distribution network of a semiconductor device.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. Skilled artisans should understand, however, that the detailed description and the specific examples, while disclosing preferred embodiments of the invention, are given by way of illustration only and not by way of limitation. Various substitutions, modifications, additions or rearrangements within the scope of the underlying inventive concept(s) will become apparent to those skilled in the art after reading this disclosure.

Figure 1:
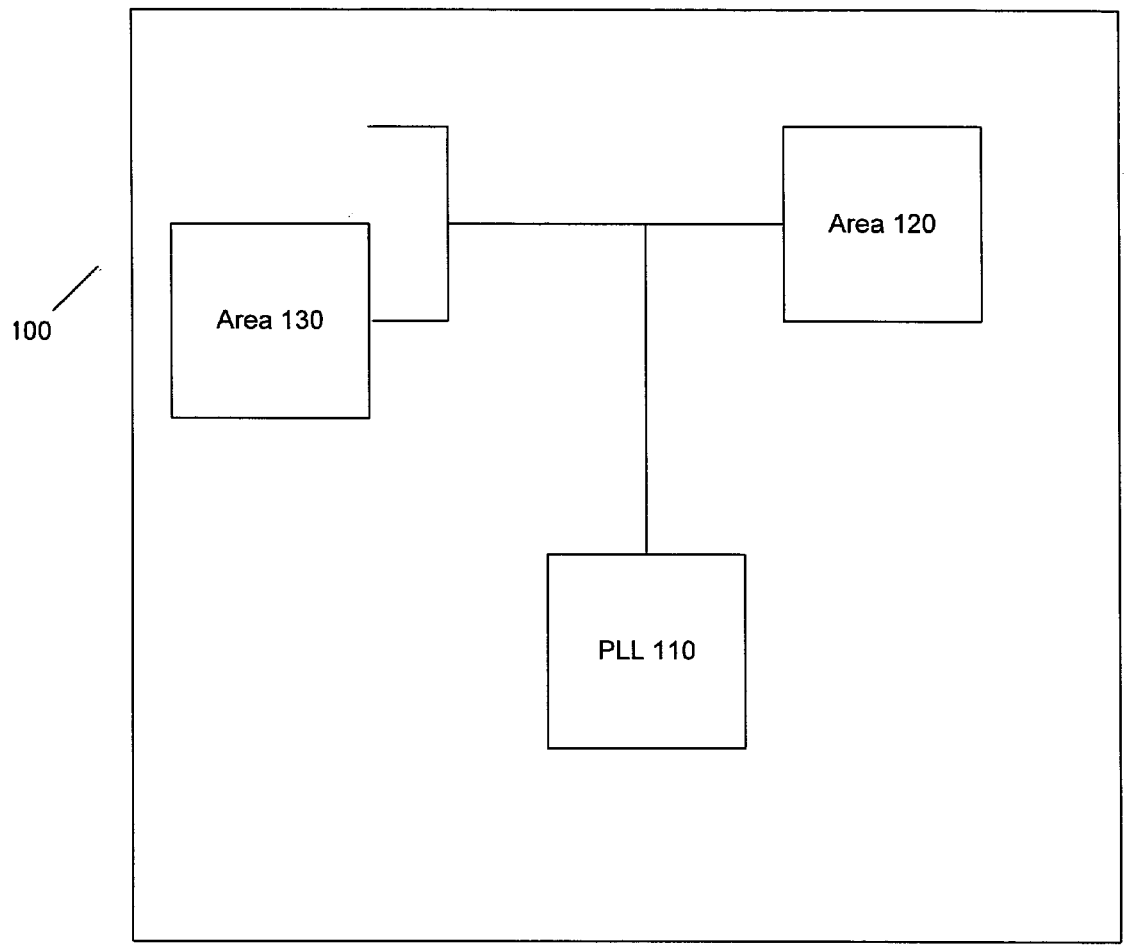
FIG. 1 depicts one embodiment of a semiconductor with a clock distribution network.
Figure 2:
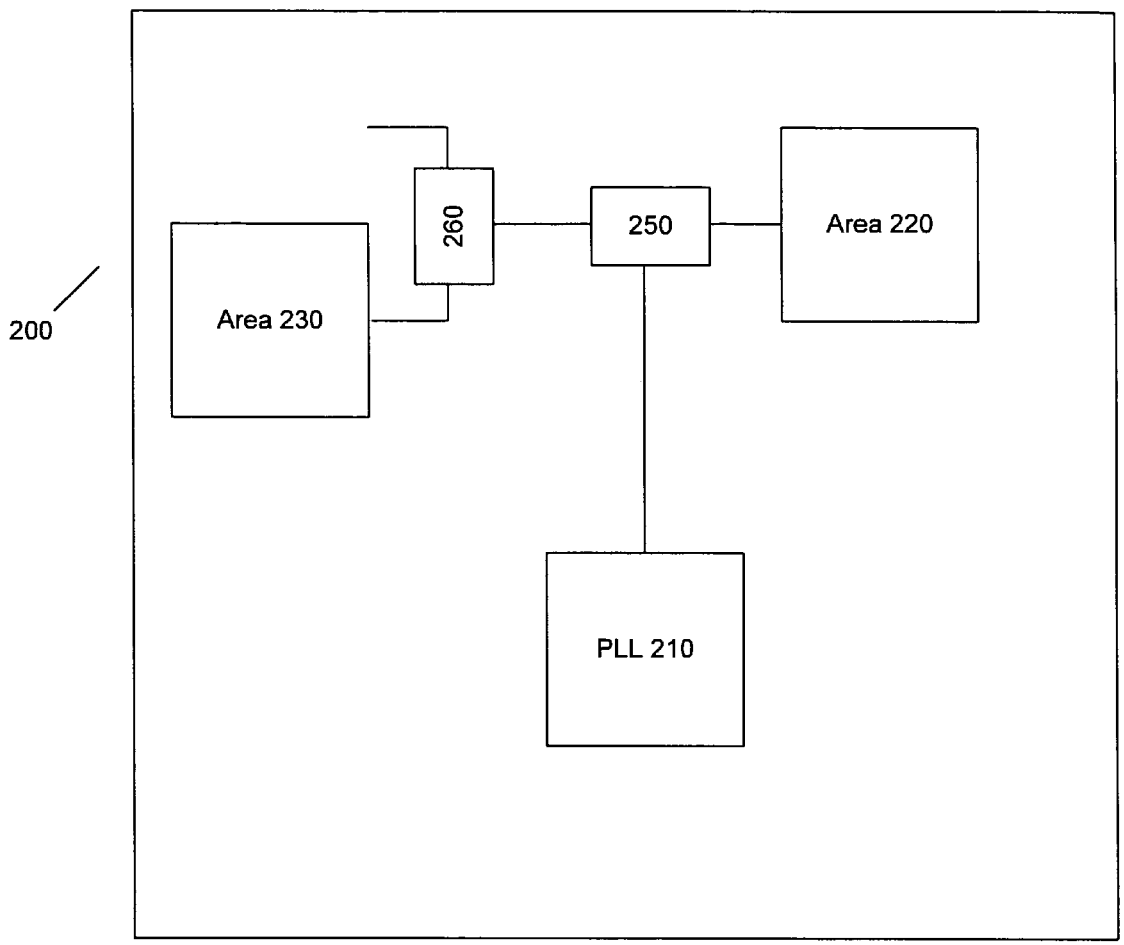
FIG. 2 depicts one embodiment of a semiconductor package with a clock distribution network.
Figure 3:
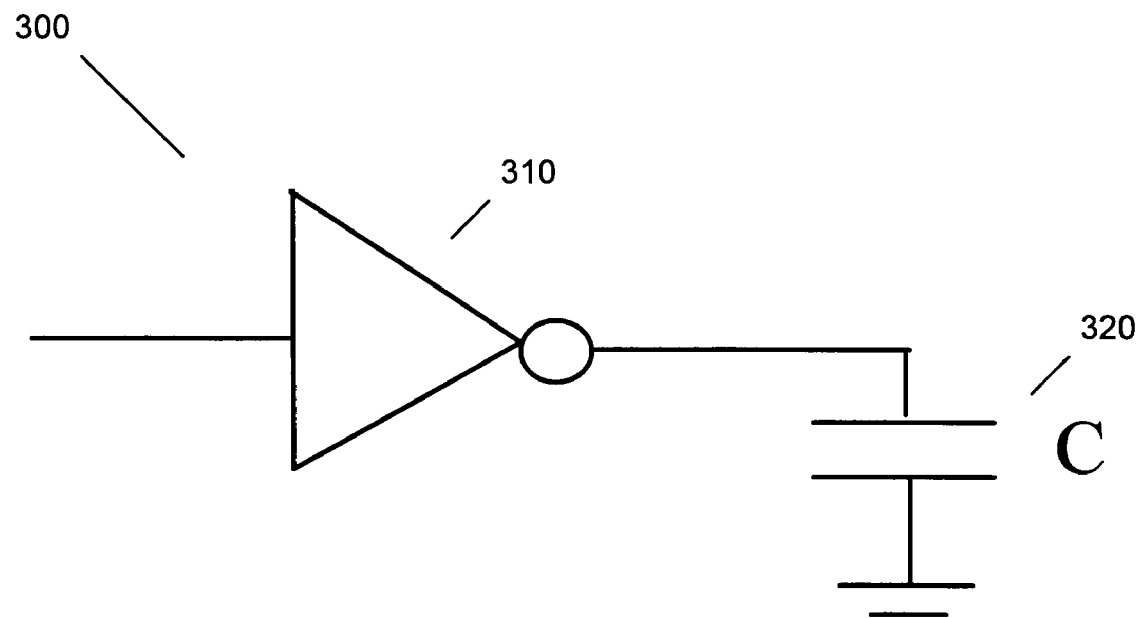
FIG. 3 depicts one embodiment of a circuit.

Reference is now made in detail to exemplary embodiments of the present invention, examples of which are illustrated in the accompanying drawings. FIG. 3 will be utilized as one embodiment of a baseline circuit in describing these exemplary embodiments. Wherever possible, the same reference numbers will be used throughout the drawings to refer to the same or like parts (elements).

Figure 4:
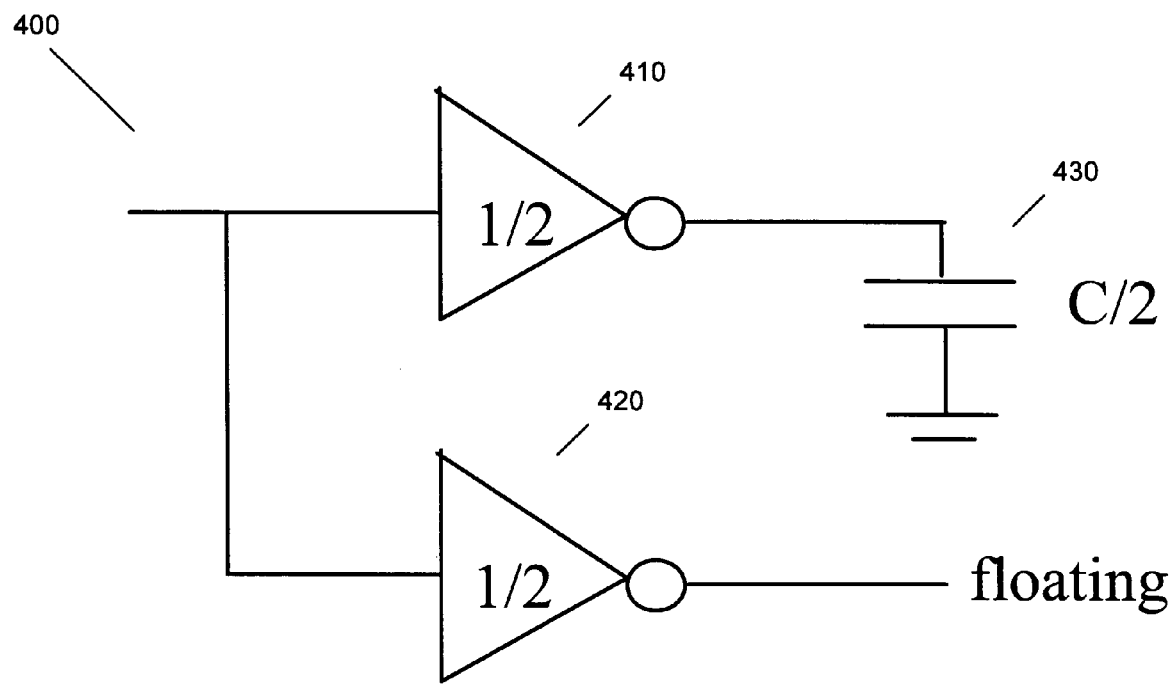
FIG. 4 depicts one embodiment of a circuit.

As mentioned above, many times it is desirable to employ a circuit for a buffer which has a drive strength which is less than the drive strength of another circuit in a system, yet that provides substantially similar input capacitance as the other circuit. An embodiment of a buffer circuit typically utilized in situations of this type which may address some of these issues is depicted in FIG. 4. Circuit 400 may have two inverters 410, 420, each of which is half the strength of inverter 310 used in conjunction with circuit 300 depicted in FIG. 3. An input clock signal may be coupled to both inverters 410, 420. The output of one half strength inverter 410 may be coupled to downstream logic 430 which has capacitance load $$\frac{C}{2},$$

while the output of the other half size inverter 420 may be left floating. Thus, circuit 400 may present substantially the same input capacitance as circuit 300 while providing approximately half the drive strength of circuit 300 to logic 430.

Another embodiment of a buffer circuit typically used in situations of this type which may also address some of the issues discussed above is depicted in FIG. 5. Circuit 500 may have an inverter 510 which is half the strength of inverter 310 used in conjunction with circuit 300 depicted in FIG. 3. The output of half size inverter 510 may be coupled to downstream logic 520 which has capacitance load $$\frac{C}{2}.$$

An input clock signal may be coupled to both inverter 510 and dummy logic 530, also with half the capacitance load $$\frac{C}{2}.$$

Thus, circuit 500 may present substantially the same input capacitance as circuit 300, but provide half the drive strength of circuit 300 to logic 520.

The use of circuits of these types may, however, present its own problems. In particular, as the frequency of clock signals rises the Miller effect of inverters within circuits may begin to manifest itself more dramatically, which in turn may effect the timing delay of these circuits. The Miller effect basically recites that the substantially simultaneous switching of both terminals of a capacitor will modify the effective capacitance between the terminals. In other words, the capacitance coupling between the input and output of nodes of inverters in a circuit induces feedback current into the circuit, and this feedback current may in turn affect the propagation of a clock signal through the circuit.

Turning back to FIG. 3, if we assume that capacitance coupling ($C_m$) is the capacitance of the coupling of the input and output nodes of baseline inverter 310, the approximate feedback current ($I_m$) of circuit 300 can be calculated with the formula:

$$I_{m300} = C_m * \frac{d(V_{out} - V_{in})}{dt}$$

where $V_{out}$ is the voltage of the output node of baseline inverter 310 and $V_{in}$ is the voltage of the input node of baseline inverter 310.

Moving now to FIG. 4, as circuit 400 receives approximately half of its feedback capacitance from the output node of inverter 410 coupled to logic 430 and the other half of its feedback current from the output of inverter 420 the output of which is floating, and each of inverters 410, 420 is approximately half the drive strength of baseline inverter, the approximate feedback current ($I_m$) of circuit 400 can be calculated with the formula:

$$I_{m400} = \frac{1}{2}C_m * \frac{d(V_{out} - V_{in})}{dt} + \frac{1}{2}C_m * \frac{d(V_{float} - V_{in})}{dt}$$

where $V_{out}$ is the voltage of the output node of half strength inverter 410, $V_{in}$ is the voltage of the input nodes of half strength inverters 410, 420 and $V_{float}$ is the voltage of the floating output node of half strength inverter 420.

Figure 5:
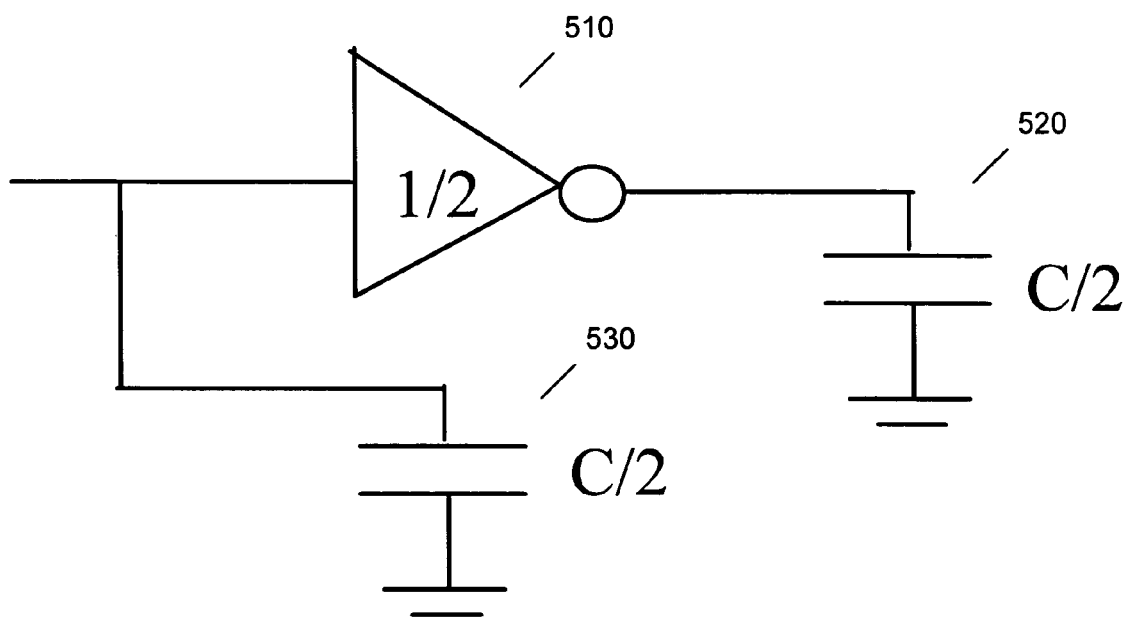
FIG. 5 depicts one embodiment of a circuit.

Similarly, looking at FIG. 5, as circuit 500 receives approximately half of its feedback capacitance from the output node of half strength inverter 510 coupled to logic 520 and the other half of its feedback current from the coupling to dummy logic 530 the feedback current ($I_m$) of circuit 500 can be calculated with the formula:

$$I_{m500} = \frac{1}{2}C_m * \frac{d(V_{out} - V_{in})}{dt} \text{ as } \frac{d(V_{gnd})}{dt} = 0$$

where $V_{out}$ is the voltage of the output node of half strength inverter 510 and $V_{in}$ is the voltage of the input node of half strength inverter 510.

As can be seen from the above equations with relation to circuits 300, 400 and 500, each of these circuits 300, 400, 500 may generate different amount of feedback current. As the feedback current generated by each of circuits 300, 400, 500 affects the delay timing and timing skew of that circuit, each of circuits 300, 400, 500 may have a different timing delay and timing skew. More particularly, as the feedback current generated by circuit 400 may be greater than the feedback current generated by circuit 300 an input signal may propagate more slowly through circuit 400 than circuit 300 even though the input capacitances presented by circuits 300 and 400 may be substantially the same. Conversely, as the feedback current generated by circuit 500 may be less than the feedback current generated by circuit 300 an input wave form may propagate more quickly through circuit 500 than circuit 300 even though the input capacitances presented by circuits 300 and 500 may be substantially the same.

Attention is now directed to systems and methods for circuits with substantially equal propagation delay where these circuits are operable to provide different drive strengths. These systems and methods may allow for a circuit with a drive strength that is some ratio of the drive strength of a baseline circuit with a baseline inverter having a drive strength suitable for driving a baseline capacitance load. Additionally, these drive circuits may have substantially the same input capacitance, timing delay or feedback current as the baseline circuit. The input of such a circuit may be coupled to three nodes, one of which is an inverter coupled to the logic to be driven, the second of which is dummy logic, and the third of which is an inverter the output of which is left floating.

Figure 6:
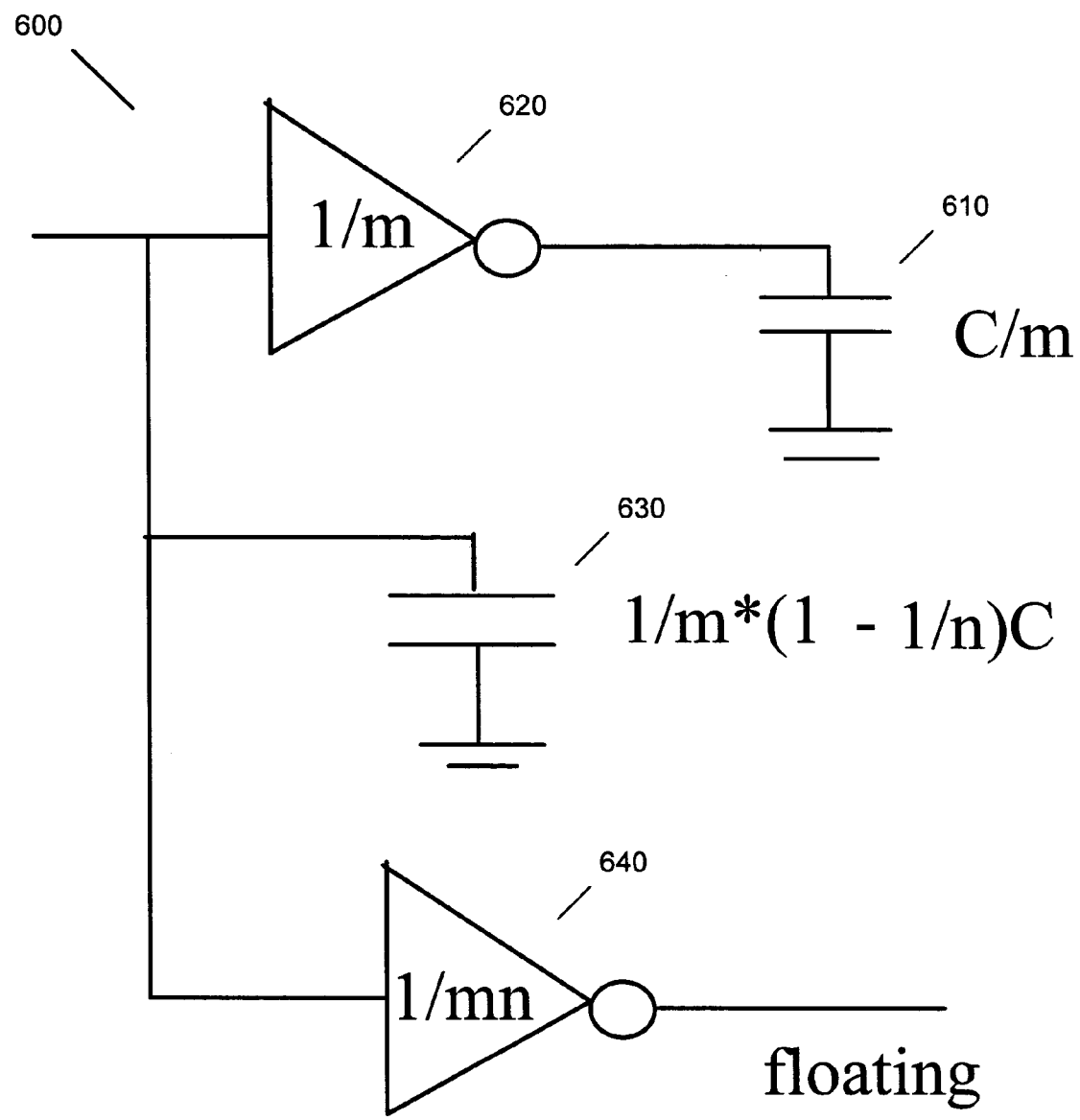
FIG. 6 depicts one embodiment of a circuit.

Turning to FIG. 6, one embodiment of just such a circuit is depicted. Circuit 600 may be suitable for providing a drive strength less than that of the drive strength of a baseline circuit while providing substantially the same input capacitance, timing delay or skew as the baseline circuit. Assume that is desired to provide a clock signal to logic 610 with a capacitance which is smaller than the capacitance (C) of logic 320 driven by circuit 300 of FIG. 3 (herein after referred to as "baseline circuit"). The ratio of capacitance between logic 610 and logic 320 may be represented by m, such that if the capacitance of logic 610 was half of the capacitance of logic 310 m would be 2, if the capacitance of logic 610 is a third of capacitance 310 m would be 3, etc. Thus, the capacitance of logic 610 may the value of $$\frac{C}{m}$$

and it is desirable that circuit 600 drive a clock signal to logic 610 with a drive strength with $$\frac{1}{m}$$

the strength of baseline circuit 300.

To accomplish this, in one embodiment, the input of circuit 600 may be coupled to three nodes, a clock driving node, a dummy capacitance node and a floating node. The clock driving node consists of inverter 620, the output of which is in turn coupled to logic 610. Inverter 620 is of strength $$\frac{1}{m}$$

the strength of baseline inverter 320 used in baseline circuit 300, and is used to drive a clock signal received at the input of circuit 600 to logic 610. The dummy capacitance node couples the input of circuit 600 to dummy logic 630 with a dummy capacitance. In one embodiment, this dummy capacitance is equal to $$\frac{1}{m}\left(1-\frac{1}{n}\right)C$$

where $$n = \frac{\frac{d(v_{float} - v_{in})}{dt}}{\frac{d(v_{out} - v_{in})}{dt}}.$$

The input of circuit 600 is also coupled to a floating node, which comprises inverter 640 of strength $$\frac{1}{mn}$$

the strength of baseline inverter 320 used in circuit 300. The output of inverter 640 is left floating.

Consequently, utilizing embodiments of the present invention similar to those depicted in FIG. 6, a circuit with a drive strength which is some ratio of the drive strength of a baseline circuit can be constructed. Additionally, these circuits may have substantially the same timing delay or input capacitances. This concept may be presented more clearly with reference to a concrete example. Suppose a circuit with half the drive strength as that of circuit 300 presented in FIG. 3, but with similar input capacitance and timing delay as circuit 300, is desired. This goal may be achieved using one embodiment of the circuit presented in FIG. 6.

Figure 7:
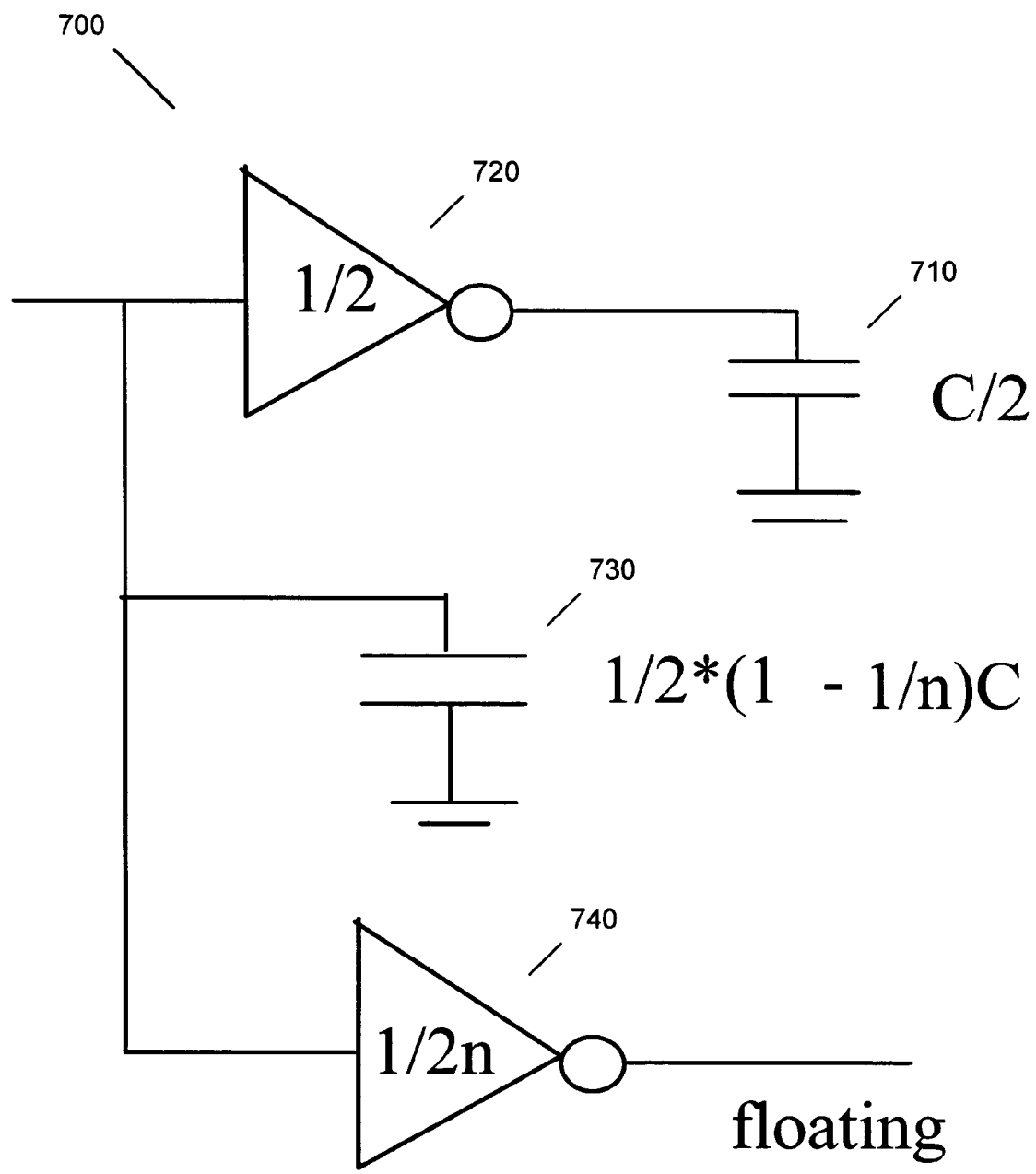
FIG. 7 depicts one embodiment of a circuit.

FIG. 7 depicts one embodiment a circuit with half the drive strength of circuit 300 of FIG. 3 created using one embodiment of the circuit depicted with respect to FIG. 6. The input of circuit 700 may be coupled to three nodes, a clock driving node, a dummy capacitance node and a floating node. The clock driving node consists of inverter 720, the output of which is in turn coupled to logic 710. Inverter 720 is of $$\frac{1}{2}$$

the strength of inverter 320 used in circuit 300, and is used to drive a clock signal received at the input of circuit 700 to logic 710. The dummy capacitance node couples the input of circuit 700 to dummy logic 730 with a dummy capacitance. In one embodiment, this dummy capacitance is equal to $$\frac{1}{2}\left(1-\frac{1}{n}\right)C$$

where $$n = \frac{\frac{d(v_{float} - v_{in})}{dt}}{\frac{d(v_{out} - v_{in})}{dt}}.$$

The input of circuit 700 is also coupled to a floating node, which comprises inverter 740 of strength $$\frac{1}{2n}$$

the strength of inverter 320 used in circuit 300. The output of inverter 740 is left floating.

The feedback current ($I_m$) of circuit 700 can be calculated with the formula:

$$I_{m700} = \frac{1}{2}C_m * \frac{d(V_{out} - V_{in})}{dt} + \frac{1}{2} * \frac{1}{n} * C_m * \frac{d(V_{float} - V_{in})}{dt}.$$

This formula may be simplified to:

$$I_{m700} = \frac{1}{2}C_m * \frac{d(V_{out} - V_{in})}{dt} + \frac{1}{2}C_m * \frac{d(V_{float} - V_{in})}{dt},$$

which in turn can be simplified to:

$$I_{m700} = C_m * \frac{d(V_{out} - V_{in})}{dt}.$$

As can be seen then, the feedback current produced by circuit 700 is substantially identical to the feedback current produced by circuit 300. Thus, circuit 700 is operable to provide half the drive strength of the drive strength of circuit 300 of FIG. 3 with substantially similar input capacitance and timing delay as that of circuit 300 of FIG. 3.

It will be apparent to those of skill in the art after reading this disclosure that traditional manufacturing processes may be utilized to achieve the structures and semiconductor packages disclosed herein. Including using masks, photomasks, x-ray masks, mechanical masks, oxidation masks, lithography etc to form the structures described with respect to the systems and methods of the present invention. Furthermore, embodiments of the systems and methods presented may be utilized no matter the type of system in which the embodiments are implemented. It will also be apparent that the particular embodiment of the invention to utilize in a particular case will depend on the characteristics of the case, and may include such factors as semiconductor type, frequency, or power consumption. The particular embodiment of the invention to be utilized may be determined based on an empirical analysis or simulation involving one or more of these factors, as will be apparent to those of ordinary skill in the art.

It will also be apparent that using embodiments that a baseline circuit or baseline inverter as the term is used herein may be of any strength whatsoever and that the term baseline has no quantitative implications. Therefore a baseline circuit may be determined based on the particular drive strength desired for a circuit, and circuits providing a drive strength which is some ratio of the drive strength of this baseline circuit may be created using embodiments of the systems and methods of the present invention. Additionally, it will be apparent that the systems and methods of the present invention may be implemented with a wide variety of gates and logic other than those depicted in the exemplary embodiments described above.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A circuit, comprising:
   an input;
   a first logic coupled to the input and operable to drive an input signal to a second logic;
   a dummy logic coupled to the input; and
   a third logic coupled to the input, wherein the output of the third logic is not coupled to the second logic, wherein the first logic is a first inverter and the third logic is a second inverter and the circuit has substantially the same input capacitance and timing delay as a baseline circuit comprising a baseline inverter with a baseline drive strength for driving a baseline capacitance load.

2. The circuit of claim 1, wherein the first inverter has a drive strength $$\frac{1}{m}$$

that of the baseline drive strength.

3. The circuit of claim 2, wherein the dummy logic has a capacitance load $$\frac{1}{m}\left(1 - \frac{1}{n}\right)$$

that of the baseline capacitance load.

4. The circuit of claim 3, wherein the second inverter has a drive strength $$\frac{1}{mn}$$

that of the baseline drive strength.

5. The circuit of claim 4, wherein the second logic has a capacitance $$\frac{1}{m}$$

that of the baseline capacitance.

6. The circuit of claim 5, wherein the input signal is a clock signal.

7. The circuit of claim 3, wherein $$\frac{\frac{d(v_{float} - v_{in})}{dt}}{\frac{d(v_{out} - v_{in})}{dt}}.$$

8. A method for driving an input signal received at an input, comprising:
   providing the input signal to a first logic operable to drive the input signal to a second logic;
   providing the input signal to a dummy logic;
   providing the input signal to a third logic, wherein the output of the second inverter is not coupled to the second logic, the first logic is a first inverter and the third logic is a second inverter; and
   providing substantially the same input capacitance and timing delay as a baseline circuit comprising a baseline inverter with a baseline drive strength for driving a baseline capacitance load.

9. The method of claim 8, wherein the first inverter has a drive strength $$\frac{1}{m}$$

that of the baseline drive strength.

10. The method of claim 9, wherein the dummy logic has a capacitance load $$\frac{1}{m}\left(1-\frac{1}{n}\right)$$

that of the baseline capacitance load.

11. The method of claim 10, wherein the second inverter has a drive strength $$\frac{1}{mn}$$

that of the baseline drive strength.

12. The method of claim 11, wherein $$n = \frac{\frac{d(v_{float} - v_{in})}{dt}}{\frac{d(v_{out} - v_{in})}{dt}}.$$

13. The method of claim 11, wherein the second logic has a capacitance $$\frac{1}{m}$$

that of the baseline capacitance.

14. The method of claim 13, wherein the input signal is a clock signal.

15. A circuit, wherein the circuit has substantially the same input capacitance and timing delay as a baseline circuit comprising a baseline inverter with a baseline drive strength for driving a baseline capacitance load, the circuit comprising:
an input;
a first inverter coupled to the input and operable to drive a clock signal at the input to a logic, wherein the first inverter has a drive strength $$\frac{1}{m}$$

that of the baseline drive strength;
a dummy logic coupled to the input, wherein the dummy logic has a capacitance load $$\frac{1}{m}\left(1-\frac{1}{n}\right)$$

that of the baseline capacitance load; and
a second inverter coupled to the input, wherein the second inverter has a drive strength $$\frac{1}{mn}$$

that of the baseline drive strength and the output of the second inverter is not coupled to the logic.

* * * * *

UNITED STATES PATENT AND TRADEMARK OFFICE
CERTIFICATE OF CORRECTION

PATENT NO. : 7,262,636 B2
APPLICATION NO. : 11/154765
DATED : August 28, 2007
INVENTOR(S) : Toshihiko Himeno and Stephen D. Weitzel It is certified that error appears in the above-identified patent and that said Letters Patent is hereby corrected as shown below:

On Title Page

Item (73) Assignee:

Insert additional Assignee: --International Business Machines Corporation, Armonk, New York--

Signed and Sealed this

Second Day of December, 2008

JON W. DUDAS
*Director of the United States Patent and Trademark Office*